US011749666B2

(12) United States Patent
Bitz et al.

(10) Patent No.: US 11,749,666 B2
(45) Date of Patent: Sep. 5, 2023

(54) SEMICONDUCTOR DIE ASSEMBLIES HAVING MOLDED UNDERFILL STRUCTURES AND RELATED TECHNOLOGY

(71) Applicant: Micron Technology, Inc., Boise, ID (US)

(72) Inventors: Bradley R. Bitz, Boise, ID (US); Xiao Li, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 169 days.

(21) Appl. No.: 17/068,234

(22) Filed: Oct. 12, 2020

(65) Prior Publication Data

US 2021/0167058 A1 Jun. 3, 2021

Related U.S. Application Data

(60) Continuation of application No. 16/106,190, filed on Aug. 21, 2018, now Pat. No. 10,804,256, which is a
(Continued)

(51) Int. Cl.
*H01L 25/00* (2006.01)
*H01L 23/31* (2006.01)
(Continued)

(52) U.S. Cl.
CPC .......... *H01L 25/50* (2013.01); *H01L 21/4882* (2013.01); *H01L 21/563* (2013.01);
(Continued)

(58) Field of Classification Search
None
See application file for complete search history.

(56) References Cited

U.S. PATENT DOCUMENTS 8,421,201 B2 4/2013 Lee et al.
8,604,615 B2 12/2013 Lee et al.
(Continued)

FOREIGN PATENT DOCUMENTS

WO WO-2012006002 A2 * 1/2012 ........... H01L 23/055

*Primary Examiner* — Scott B Geyer
(74) *Attorney, Agent, or Firm* — Perkins Coie LLP

(57) ABSTRACT

A semiconductor die assembly in accordance with an embodiment of the present technology includes first and second semiconductor dies and a package substrate carrying the first and second semiconductor dies. The second semiconductor die includes a first peripheral portion extending laterally outward beyond a first edge surface of the first semiconductor die. Similarly, the package substrate includes a second peripheral portion extending laterally outward beyond a second edge surface of the second semiconductor die. The semiconductor die assembly further includes a first volume of molded underfill material between the first and second semiconductor dies, a second volume of molded underfill material between the package substrate and the second semiconductor die, a first molded peripheral structure laterally adjacent to the first edge surface of the first semiconductor die, and a second molded peripheral structure laterally adjacent to the second edge surface of the second semiconductor die.

19 Claims, 7 Drawing Sheets

Related U.S. Application Data division of application No. 15/345,973, filed on Nov. 8, 2016, now Pat. No. 10,074,633.

(51) Int. Cl.
*H01L 25/065* (2023.01)
*H01L 21/56* (2006.01)
*H01L 21/48* (2006.01)
*H01L 23/367* (2006.01)

(52) U.S. Cl.
CPC ........ *H01L 21/565* (2013.01); *H01L 23/3128* (2013.01); *H01L 23/367* (2013.01); *H01L 25/0657* (2013.01); H01L 23/3121 (2013.01); H01L 2224/16145 (2013.01); H01L 2224/16225 (2013.01); H01L 2224/17181 (2013.01); H01L 2224/73253 (2013.01); H01L 2225/06513 (2013.01); H01L 2225/06517 (2013.01); H01L 2225/06541 (2013.01); H01L 2225/06565 (2013.01); H01L 2225/06568 (2013.01); H01L 2225/06586 (2013.01); H01L 2225/06589 (2013.01); H01L 2924/1431 (2013.01); H01L 2924/1434 (2013.01); H01L 2924/15311 (2013.01); H01L 2924/16251 (2013.01)

(56) References Cited

U.S. PATENT DOCUMENTS

| | | | |
|---|---|---|---|
| 8,803,334 B2 | 8/2014 | Choi et al. | |
| 9,324,582 B2 | 4/2016 | Lin et al. | |
| 9,337,119 B2* | 5/2016 | Vadhavkar | H01L 23/473 |
| 9,953,904 B1* | 4/2018 | Oratti Kalandar | H01L 23/49568 |
| 10,074,633 B2* | 9/2018 | Bitz | H01L 21/4882 |
| 11,329,026 B2* | 5/2022 | Hembree | H01L 23/3675 |
| 2002/0074637 A1 | 6/2002 | McFarland | |
| 2008/0272486 A1 | 11/2008 | Wang et al. | |
| 2010/0109169 A1 | 5/2010 | Kolan et al. | |
| 2011/0062592 A1 | 3/2011 | Lee et al. | |
| 2011/0147916 A1* | 6/2011 | Su | H01L 23/433 257/692 |
| 2012/0043668 A1* | 2/2012 | Refai-Ahmed | H01L 23/42 438/109 |
| 2012/0049382 A1 | 3/2012 | Malatkar | |
| 2013/0052775 A1* | 2/2013 | Kim | H01L 23/34 438/118 |
| 2013/0056864 A1 | 3/2013 | Cho et al. | |
| 2013/0082399 A1 | 4/2013 | Kim et al. | |
| 2014/0015106 A1 | 1/2014 | Hsieh et al. | |
| 2014/0015598 A1 | 1/2014 | Groothuis et al. | |
| 2014/0131886 A1 | 5/2014 | Paek et al. | |
| 2014/0213017 A1 | 7/2014 | Kim et al. | |
| 2014/0284785 A1 | 9/2014 | Sung et al. | |
| 2014/0367844 A1 | 12/2014 | Hooper et al. | |
| 2015/0035134 A1* | 2/2015 | Hung | H01L 24/92 257/712 |
| 2015/0035135 A1* | 2/2015 | Hung | H01L 23/3672 257/712 |
| 2015/0130078 A1 | 5/2015 | Hong et al. | |
| 2015/0137345 A1* | 5/2015 | Choi | H01L 23/04 257/713 |
| 2015/0262973 A1* | 9/2015 | Wang | H01L 23/3128 438/109 |
| 2015/0348954 A1* | 12/2015 | Chandolu | H01L 25/18 257/737 |
| 2016/0064355 A1 | 3/2016 | Pan et al. | |
| 2016/0172268 A1* | 6/2016 | Katkar | H01L 25/0652 257/774 |
| 2016/0284670 A1* | 9/2016 | Hung | H01L 23/3675 |
| 2016/0343639 A1* | 11/2016 | Groothuis | F28D 15/0233 |
| 2016/0343687 A1* | 11/2016 | Vadhavkar | H01L 23/3675 |
| 2017/0040253 A1 | 2/2017 | Kim et al. | |
| 2017/0194292 A1 | 7/2017 | Yu et al. | |
| 2018/0012865 A1 | 1/2018 | Schrock | |
| 2018/0108592 A1 | 4/2018 | Hembree et al. | |
| 2018/0130773 A1 | 5/2018 | Bitz et al. | |
| 2022/0275500 A1* | 9/2022 | Shen | H01L 21/68735 |

\* cited by examiner

SEMICONDUCTOR DIE ASSEMBLIES HAVING MOLDED UNDERFILL STRUCTURES AND RELATED TECHNOLOGY

CROSS-REFERENCE TO RELATED APPLICATIONS

This application is a continuation of U.S. application Ser. No. 16/106,190, filed Aug. 21, 2018, now U.S. Pat. No. 10,804,256, which is a divisional of U.S. application Ser. No. 15/345,973, filed Nov. 8, 2016, now U.S. Pat. No. 10,074,633, which are incorporated herein by reference in their entirety.

TECHNICAL FIELD

The present technology is related to packaged semiconductor dies.

BACKGROUND

Packaged semiconductor dies, including memory chips, microprocessor chips, MEMS, and imager chips, typically include a semiconductor die mounted on a substrate and encased in a plastic protective covering. The die includes functional features, such as memory cells, processor circuits, and imager devices, as well as bond pads electrically connected to the functional features. The bond pads can be electrically connected to terminals outside the protective covering to allow the die to be connected to higher level circuitry.

Market pressures continually drive semiconductor manufacturers to reduce the size of die packages to fit within the space constraints of electronic devices, while concurrently increasing the functional capacity of each package to meet operating parameters. One approach for increasing the processing power of a semiconductor package without substantially increasing the surface area covered by the package (i.e., the package's "footprint") is to vertically stack multiple semiconductor dies on top of one another in a single package. The dies in such vertically-stacked packages can be interconnected by electrically coupling the bond pads of the individual dies with the bond pads of adjacent dies using through-silicon vias.

A challenge associated with vertically stacked die packages is that the heat generated by the individual dies combines and increases the operating temperatures of the individual dies, the junctions therebetween, and the package as a whole. This can cause the stacked dies to reach temperatures above their maximum operating temperatures, especially as the density of the dies in the package increases.

DETAILED DESCRIPTION

Figure 1A:
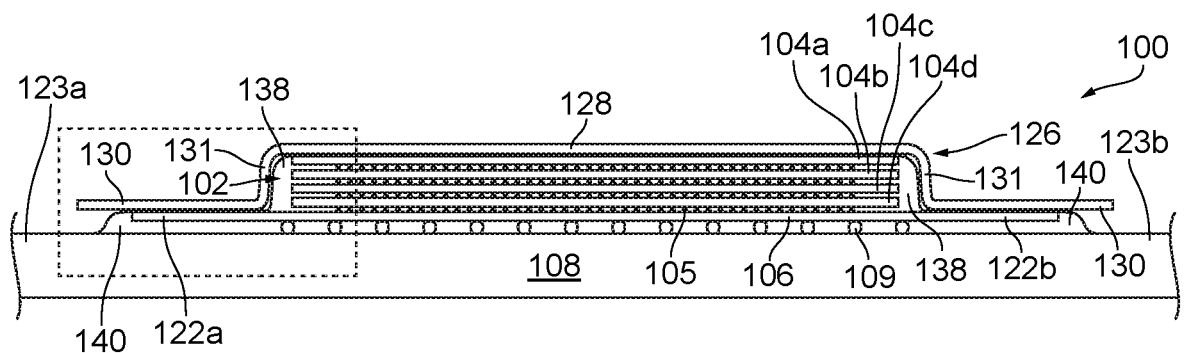
FIG. 1A is a cross-sectional side view of a semiconductor die assembly in accordance with an embodiment of the present technology.

Semiconductor dies are often stacked in a package and then vacant spaces between the semiconductor dies are filled with capillary underfill (CUF) material. Filling these intervening spaces improves the reliability of the package by reducing or eliminating warping and fracturing that may result from different degrees of thermal expansion and contraction at different portions of the package. Furthermore, in the context of thermally challenging packages, high thermal conductivity CUF material is sometimes used to facilitate heat dissipation. To introduce CUF material into the spaces between semiconductor dies in a stack, a reservoir of liquid CUF material is first disposed along a perimeter of the spaces. Capillary action, sometimes with vacuum assistance, is then used to draw the CUF material into the intervening spaces. Once the CUF material is distributed throughout the intervening spaces, the package is heated to cure the CUF material into a solid form. In order to flow by capillary action, the primary component of conventional CUF materials is usually an epoxy resin or a similar material with low initial viscosity and the capacity to be hardened by a curing process.

Conventional CUF materials have several disadvantages in the context of complex packages that include stacked semiconductor dies. As discussed above, achieving adequate heat dissipation is a significant technical challenge with regard to these packages. Unfortunately, epoxy resin and other flowable and curable components of CUF materials tend to have relatively low thermal conductivities. Although particles of higher thermal conductivity material may be embedded in these flowable and curable materials, these embedded particles interfere with the ability of CUF materials to flow by capillary action. Accordingly, the potential of embedded particles of relatively high thermal conductivity material for increasing the overall thermal conductivity of CUF materials is limited. Another problem arises when CUF materials are used in a space between two semiconductor dies having different footprints. In this context, CUF materials are likely to form a large fillet around the perimeter of the intervening space. The presence of this large fillet may interfere with heat dissipation from an adjacent portion of the semiconductor die having the larger footprint. Moreover, the geometry of CUF material fillets often varies considerably depending on the height of the adjacent intervening space. The heights of intervening spaces in semiconductor die assemblies are often difficult to control due to imprecision associated with flip-chip mounting techniques. Accordingly, the geometry of CUF material fillets often varies from one package to another. Among other disadvantages, this variation in the geometry of CUF material fillets may complicate fitting packages with lid-type heat spreaders.

Semiconductor die assemblies and related devices, systems, and methods in accordance with embodiments of the present technology can at least partially address one or more of the foregoing and/or other problems associated with conventional technologies. Semiconductor die assemblies in accordance with at least some embodiments of the present technology include high thermal conductivity molded underfill (MUF) material in place of lower thermal conductivity CUF materials. Unlike CUF materials, MUF materials can often be loaded with relatively high concentrations of high thermal conductivity particles without becoming insufficiently flowable. Accordingly, MUF materials tend to have higher thermal conductivities (e.g., 5 times higher or more in some cases) than CUF materials.

As another advantage, at least some MUF materials can be distributed throughout a space between two semiconductor dies having different footprints without forming a large fillet. This can increase the laterally protruding die region available for thermal coupling to a heat spreader. Furthermore, the geometry of MUF fillets or other peripheral structures made of MUF material can be relatively consistent from one package to another, even when the heights of the adjacent intervening spaces are inconsistent. This can facilitate use of highly conformal lid-type heat spreaders of simple and consistent construction. For example, these heat spreaders can be thermally coupled to multiple semiconductor dies within a package at multiple elevations with little or no potential for shape incompatibility. Other advantages over conventional counterparts in addition to or instead of the foregoing advantages also may be present. Furthermore, as described below, semiconductor die assemblies and related devices, systems, and methods in accordance with embodiments of the present technology can have features in addition to or instead of features associated with use of MUF materials in place of a CUF material.

Specific details of semiconductor die assemblies and related devices, systems, and methods in accordance with several embodiments of the present technology are disclosed herein with reference to FIGS. 1-5. Although these embodiments may be disclosed herein primarily or entirely in the context of hybrid packages containing logic and memory components, other suitable contexts are within the scope of the present technology. For example, suitable features of disclosed hybrid packages can be implemented in the context of memory-only packages or in the context of logic-only packages. Other devices, systems, and methods in addition to those disclosed herein may be within the scope of the present technology. For example, devices, systems, and methods in accordance with embodiments of the present technology can have different and/or additional configurations, components, or procedures than those disclosed herein. Moreover, a person of ordinary skill in the art will understand that devices, systems, and methods in accordance with embodiments of the present technology can be without configurations, components, or procedures disclosed herein without deviating from the present technology.

Figure 1B:
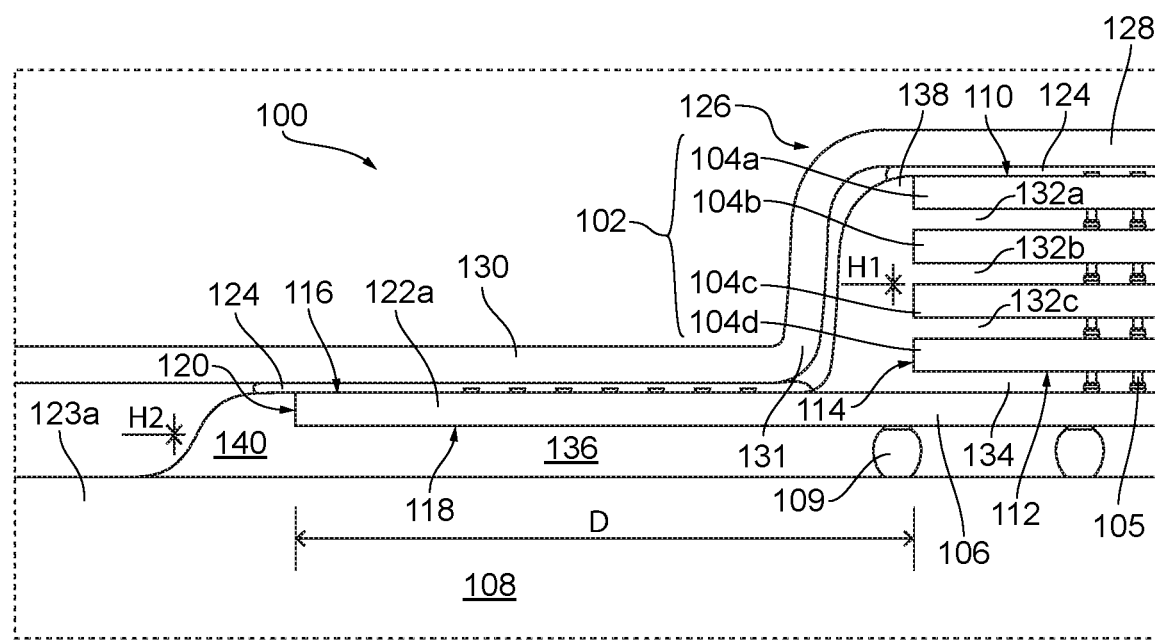
FIG. 1B is an enlarged view of a portion of FIG. 1A.

FIG. 1A is a cross-sectional side view of a semiconductor die assembly 100 in accordance with an embodiment of the present technology, and FIG. 1B is an enlarged view of a portion of FIG. 1A. With reference to FIGS. 1A and 1B together, the semiconductor die assembly 100 can include a stack 102 of first semiconductor dies 104 (individually identified as first semiconductor dies 104a-104d). In the illustrated embodiment, the stack 102 includes four first semiconductor dies 104 electrically coupled to one another by laterally spaced apart pillar-type interconnects 105. In other embodiments, a counterpart of the semiconductor die assembly 100 can include a single first semiconductor die 104, or a stack of a different number (e.g., 2, 3, 5, 6, 8, 12 etc.) of first semiconductor dies 104. Furthermore, some or all of the laterally spaced apart pillar-type interconnects 105 can be replaced with wire bond-type interconnects and associated film-over-wire material.

With reference again to the illustrated embodiment, the semiconductor die assembly 100 can further include a second semiconductor die 106 carrying the stack 102 and laterally spaced apart pillar-type interconnects 105 electrically coupling the second semiconductor die 106 to the stack 102. The semiconductor die assembly 100 can also include a package substrate 108 carrying the second semiconductor die 106 and laterally spaced apart solder-ball interconnects 109 electrically coupling the package substrate 108 to the second semiconductor die 106

In FIGS. 1A and 1B, the semiconductor die assembly 100 is shown in an orientation in which the second semiconductor die 106 underlies the stack 102, and the package substrate 108 underlies the second semiconductor die 106. In this orientation, the stack 102 has an upper major surface 110 (FIG. 1B), a lower major surface 112 (FIG. 1B), and an edge surface 114 (FIG. 1B) extending between a perimeter portion of the upper major surface 110 and a perimeter portion of the lower major surface 112. The upper surface 110 and lower surface 112 of the stack 102 may or may not have exposed topographies. Similarly, the second semiconductor die 106 has an upper major surface 116 (FIG. 1B), a lower major surface 118 (FIG. 1B), and an edge surface 120 (FIG. 1B) extending between a perimeter portion of the upper major surface 116 and a perimeter portion of the lower major surface 118. The stack 102 can have a footprint smaller than a footprint of the second semiconductor die 106 such that the second semiconductor die 106 includes peripheral portions 122 (individually identified as peripheral portions 122a, 122b) extending laterally outward beyond the edge surface 114 of the stack 102 a distance D (FIG. 1B). For example, when the stack 102 has a rectangular footprint, the peripheral portions 122a, 122b can extend laterally outward beyond opposite respective sides of the edge surface 114 of the stack 102 by the same or different distances D. Similarly, the second semiconductor die 106 can have a footprint smaller than a footprint of the package substrate 108 such that the package substrate 108 includes peripheral portions 123 (individually identified as peripheral portions 123a, 123b) extending laterally outward beyond the edge surface 120 of the second semiconductor die 106.

In some cases, the first semiconductor dies 104 are memory dies and the second semiconductor die 106 is a logic die. In these and other cases, the peripheral portions 122 of the second semiconductor die 106 can include serializer/deserializer functional blocks (not shown) that generate a disproportionally high amount of heat relative to other portions of the second semiconductor die 106, and even more so relative to portions of the first semiconductor dies 104. The semiconductor die assembly 100 can include features that facilitate efficient upward dissipation of this heat from the peripheral portions 122 of the second semiconductor die 106 when the semiconductor die assembly 100 is in the illustrated orientation. The semiconductor die assembly 100 can also include features that facilitate efficient upward dissipation of heat from the stack 102 and from a portion of the second semiconductor die 106 directly underlying the stack 102 when the semiconductor die assembly 100 is in the illustrated orientation.

The semiconductor die assembly 100 can include thermal interface features 124 (FIG. 1B) in direct contact with the first and second semiconductor dies 104, 106. For example, the thermal interface features 124 can be in direct contact with the upper major surface 116 of the second semiconductor die 106 at the peripheral portion 122a of the second semiconductor die 106, another thermal interface feature 124 can be in direct contact with the upper major surface 116 of the second semiconductor die 106 at the peripheral portion 122b of the second semiconductor die 106, and another thermal interface feature 124 can be in direct contact with the upper major surface 110 of the stack 102.

The semiconductor die assembly 100 can further include a lid-type heat spreader 126 (e.g., a thermally conductive casing) thermally coupled to the first and second semiconductor dies 104, 106 via the thermal interface features 124. The heat spreader 126 can be a sheet of metal formed (e.g., press-formed), machined, or made in another suitable manner to have a raised center portion 128, a lower peripheral portion 130, and a riser 131 therebetween. Suitable materials for the heat spreader 126 other than metal include thermally conductive ceramics. An elevation difference between the center portion 128 and the peripheral portion 130 of the heat spreader 126 can correspond to an elevation difference between the upper major surface 110 of the stack 102 and the upper major surface 116 of the second semiconductor die 106. The heat spreader 126 can be hat type, with multiple cavities or without a cavity. The thermal interface features 124 can be configured to fill voids and to smooth irregularities at interfaces between the heat spreader 126 and the first and second semiconductor dies 104, 106. In the illustrated embodiment, the thermal interface features 124 are volumes of thermal interface paste, such as silicone-based grease doped with thermally conductive particles. In other embodiments, counterparts of one, some, or all of the thermal interface features 124 can be pieces of thermal interface tape or have another suitable form. Furthermore, one or more lid seals can be included between the package substrate 108 and the peripheral portion 130 of the heat spreader 126 and/or at other suitable locations for enhanced structural support.

As discussed above, the semiconductor die assembly 100 can include a molded underfill (MUF) material where a capillary underfill (CUF) material would conventionally be used. For example, the semiconductor die assembly 100 can include volumes of MUF material 132 (individually identified as volumes of MUF material 132a-132c in FIG. 1B) between individual first semiconductor dies 104 of the stack 102. The semiconductor die assembly 100 can further include a volume of MUF material 134 (FIG. 1B) between the lower major surface 112 of the stack 102 and the upper major surface 116 of the second semiconductor die 106. The volumes of MUF material 132, 134 can extend around the pillar-type interconnects 105. The semiconductor die assembly 100 can also include a volume of MUF material 136 (FIG. 1B) between the package substrate 108 and the lower major surface 118 of the second semiconductor die 106. The volume of MUF material 136 can extend around the solder-ball interconnects 109. The volumes of MUF material 132, 134, 136 can have relatively high thermal conductivities, such as thermal conductivities of at least 0.5 watt per meter kelvin (e.g., within a range from 1 watt per meter kelvin to 3 watts per meter kelvin).

High thermal conductivity MUF materials can also be present adjacent to the edge surface 114 of the stack 102 and adjacent to the edge surface 120 of the second semiconductor die 106. For example, the semiconductor die assembly 100 can include a volume of MUF material that forms a first molded peripheral structure 138 laterally adjacent to the edge surface 114 of the stack 102 and overlying at least one of the peripheral portions 122 of the second semiconductor die 106 when the semiconductor die assembly 100 is in the illustrated orientation. Similarly, the semiconductor die assembly 100 can include another volume of MUF material that forms a second molded peripheral structure 140 laterally adjacent to the edge surface 120 of the second semiconductor die 106 and overlying at least one of the peripheral portions 123 of the package substrate 108 when the semiconductor die assembly 100 is in the illustrated orientation. The first and second molded peripheral structures 138, 140 can protect the edge surface 114 of the stack 102 and the edge surface 120 of the second semiconductor die 106 from being damaged during subsequent handling. In some cases, the first and second molded peripheral structures 138, 140 extend continuously around the entire perimeters of the stack 102 and the second semiconductor die 106, respectively. In other cases, the first molded peripheral structure 138 is discontinuous and/or the second molded peripheral structure 140 is discontinuous.

As discussed above, the composition of the MUF material in the semiconductor die assembly 100 can facilitate heat dissipation from the first and second semiconductor dies 104, 106. In addition or alternatively, the shapes of the structures formed from the MUF material can facilitate this heat dissipation. For example, the first molded peripheral structure 138 can cover relatively little of the surface area of the underlying peripheral portions 122 of the second semiconductor die 106 such that a large amount of this surface area available for thermal coupling to the heat spreader 126 via the thermal interface features 124. In at least some cases, the first molded peripheral structure 138 covers at most 30% (e.g., at most 20%) of a total area of the upper major surface 116 of the second semiconductor die 106 at the peripheral portions 122 of the second semiconductor die 106. The first molded peripheral structure 138 can be between the riser 131 of the heat spreader 126 and the stack 102. In the illustrated embodiment, the first molded peripheral structure 138 is not thermally coupled to the riser 131. In other embodiments, the first molded peripheral structure 138 can be thermally coupled to the riser 131, such as by incorporating an intervening thermal interface feature.

As shown in FIG. 1B, the first and second molded peripheral structures 138, 140 can taper inwardly as they extend away from the second semiconductor die 106 and the package substrate 108, respectively. This tapering can facilitate release of the first and second molded peripheral structures 138, 140 from corresponding mold cavities (not shown). The tapering, however, increases the footprints of the first and second molded peripheral structures 138, 140. Increasing the footprint of the first molded peripheral structure 138 may have a greater impact on heat dissipation than increasing the footprint of the second molded peripheral structure 140. Thus, in at least some cases, the taper of the second molded peripheral structure 140 is greater than the taper of the first molded peripheral structure 138. For example, the second molded peripheral structure 140 can have a second mid-height draft angle at a height H2 greater than (e.g., at least 50% greater than) a corresponding first mid-height draft angle at a height H1 of the first molded peripheral structure 138. The mid-height draft angle of the first molded peripheral structure 138 can be within a range from 0.5 degree to 5 degrees. These and/or other attributes of the first and second molded peripheral structures 138, 140 can increase the area of the peripheral portions 122 of the second semiconductor die 106 available for thermal coupling to the heat spreader 126 without unduly sacrificing mold-release properties.

Figure 2:
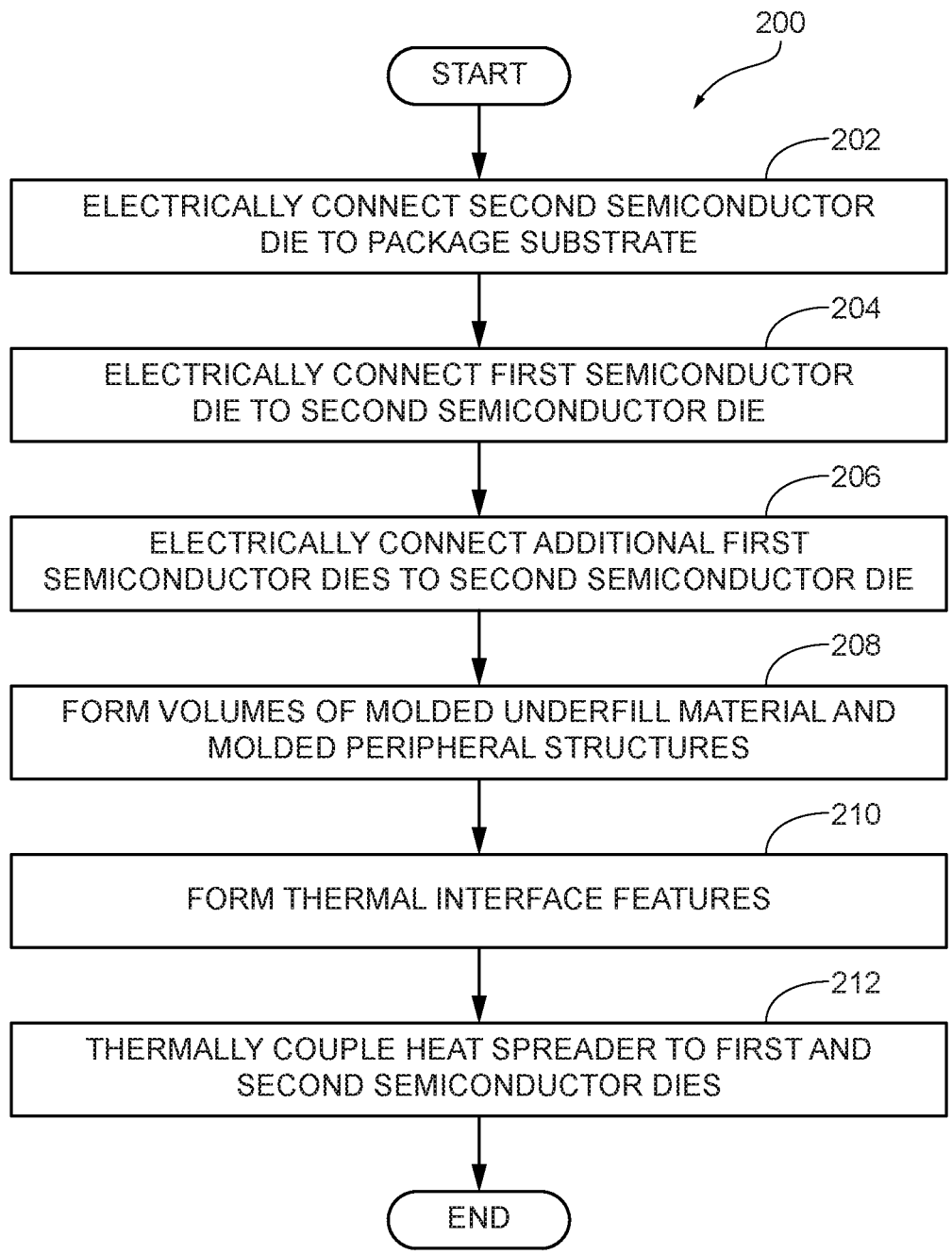
FIG. 2 is a flow chart illustrating a method for making a semiconductor die assembly in accordance with an embodiment of the present technology.
Figure 3A:
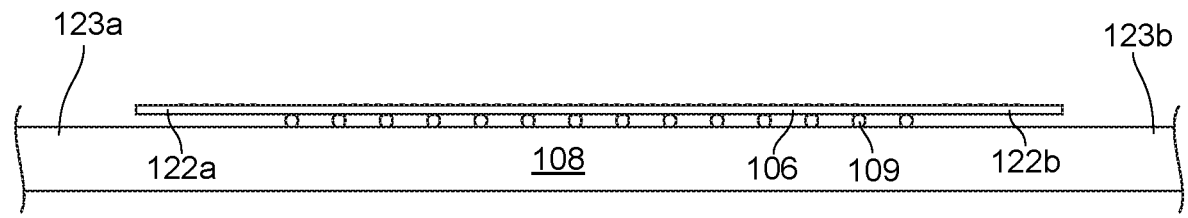
FIGS. 3A-3H are cross-sectional side views of portions of the semiconductor die assembly shown in FIG. 1A at different respective stages during the method shown in FIG. 2.
Figure 3B:
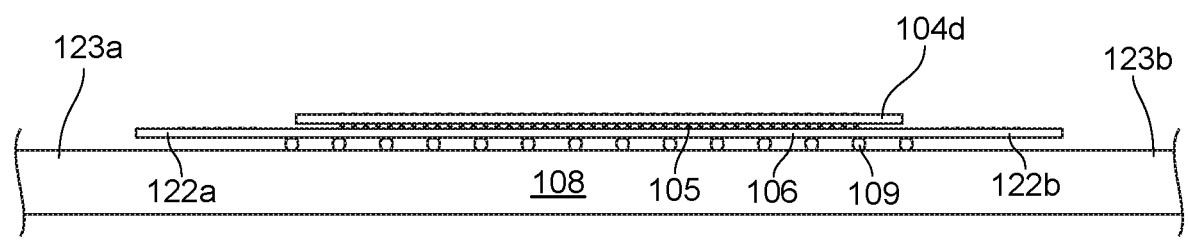
Figure 3C:
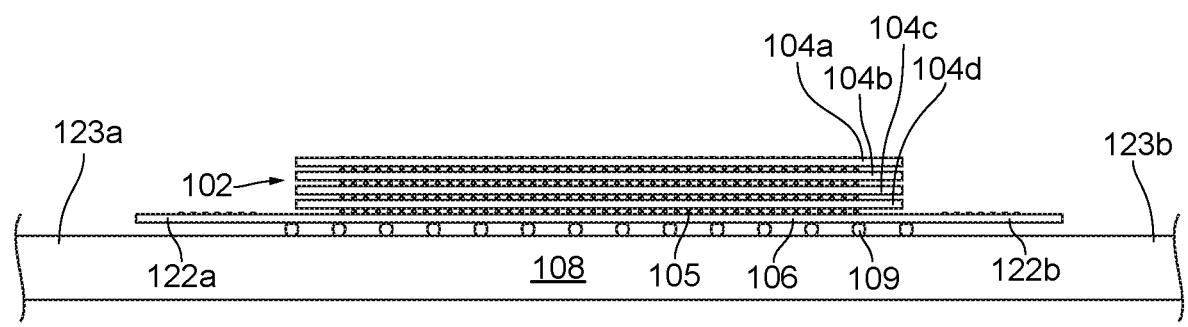

FIG. 2 is a flow chart illustrating a method 200 for making the semiconductor die assembly 100 in accordance with an embodiment of the present technology, and FIGS. 3A-3H are cross-sectional side views of portions of the semiconductor die assembly 100 at different respective stages during the method 200. With reference first to FIGS. 2 and 3A together, the method 200 can include electrically connecting the second semiconductor die 106 to the package substrate 108 via the solder-ball interconnects 109 (block 202). With reference to FIGS. 2 and 3B together, the method 200 can then include electrically connecting one of the first semiconductor dies 104 to the second semiconductor die 106 via a lowermost row of the pillar-type interconnects 105 (block 204). With reference to FIGS. 2 and 3C together, the method 200 can then include electrically connecting additional first semiconductor dies 104 to the second semiconductor die 106 via additional rows of the pillar-type interconnects 105 (block 206). In another embodiment, the first semiconductor dies 104 and the second semiconductor die 106 can be electrically interconnected first, and the resulting assembly can then be electrically connected to the package substrate 108.

Figure 3D:
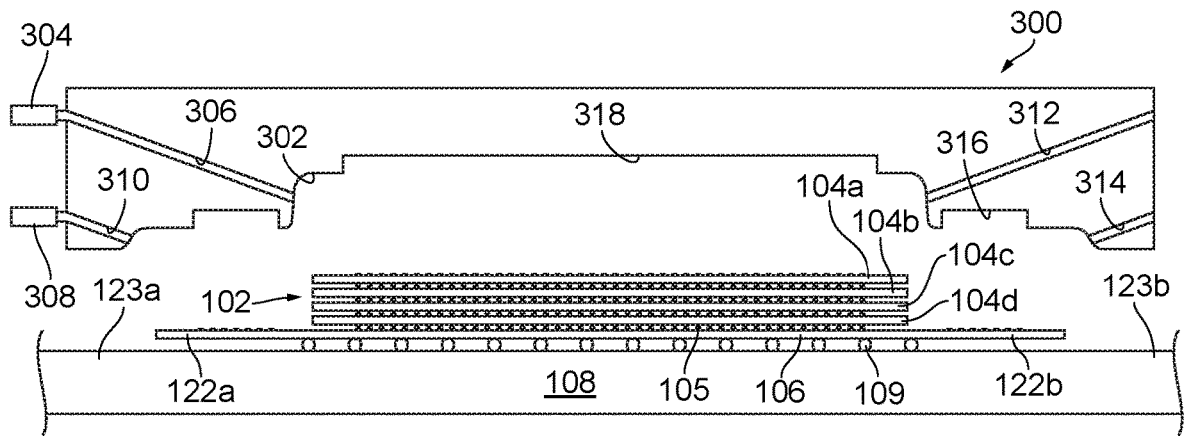

With reference now to FIGS. 2 and 3D-3F together, the method 200 can include forming the volumes of MUF material 132, 134, 136 and forming the first and second molded peripheral structures 138, 140 (block 208) by transfer molding or another suitable molding technique. As shown in FIG. 3D, a mold 300 can be aligned with the first semiconductor dies 104 and the second semiconductor die 106. The mold 300 can define a cavity 302 shaped to receive the first semiconductor dies 104 and the second semiconductor die 106. The mold 300 can further include a first inlet 304 and a first channel 306 extending between the first inlet 304 and an upper portion of the cavity 302. Similarly, the mold 300 can include a second inlet 308 and a second channel 310 extending between the second inlet 308 and a lower portion of the cavity 302. The mold 300 can also include first and second vents 312, 314 configured to vent displaced air from the upper and lower portions of the cavity 302, respectively.

Figure 3E:
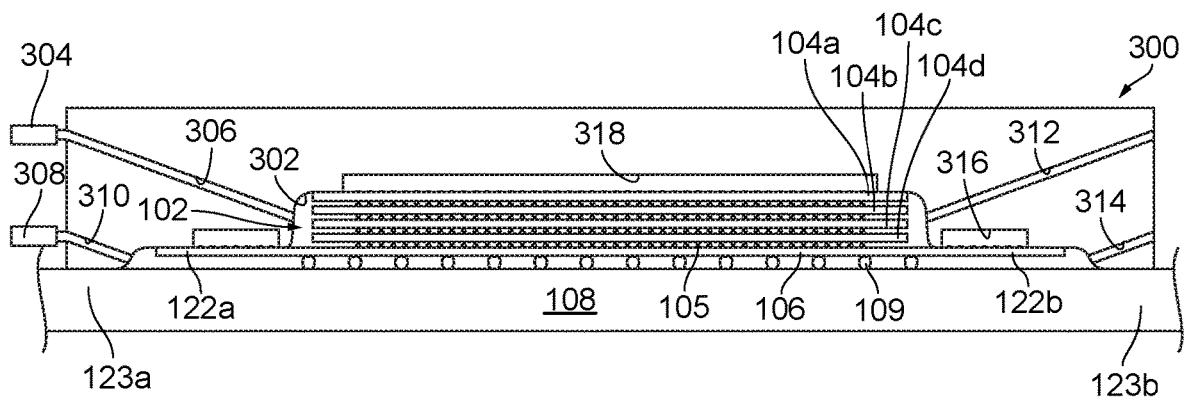
Figure 3F:
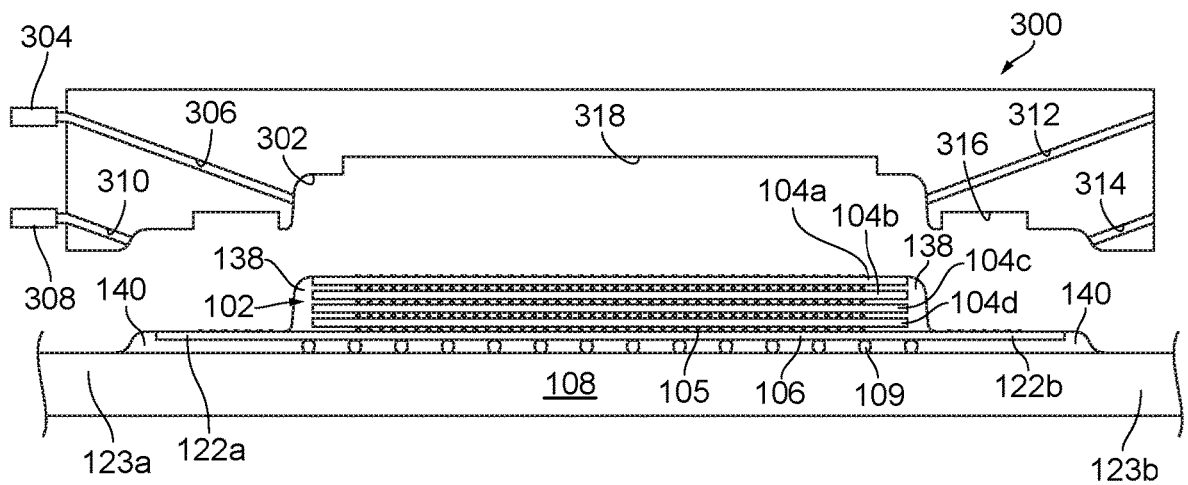

As shown in FIG. 3E, the mold 300 can be positioned relative to the first semiconductor dies 104 and the second semiconductor die 106 or vice versa to locate the first semiconductor dies 104 and the second semiconductor die 106 within the cavity 302. Next, a MUF material can be introduced into the cavity 302 at greater than atmospheric pressure via the first and second inlets 304, 308 and via the first and second channels 306, 310. The mold 300 can be configured to seal against the upper major surface 116 of the second semiconductor die 106 to fluidically separate the upper portion of the cavity 302 fed by the first inlet 304 and the first channel 306 from the lower portion of the cavity 302 fed by the second inlet 308 and the second channel 310. The mold 300 can include clearances 316 positioned to receive surface features on the upper major surface 116 of the second semiconductor die 106. The mold 300 can also be configured to seal against the upper major surface 110 of the stack 102 to prevent the MUF material from fully covering this surface. Again, the, mold 300 can optionally include a clearance 318 positioned to receive surface features on the upper major surface 110 of the stack 102. As shown in FIG. 3F, after the MUF material is introduced into the cavity 302, the mold 300 can be withdrawn, leaving the MUF material behind in the form of the volumes of MUF material 132, 134, 136 and the first and second molded peripheral structures 138, 140. The MUF material can be cured before and/or after the mold 300 is withdrawn.

Figure 3G:
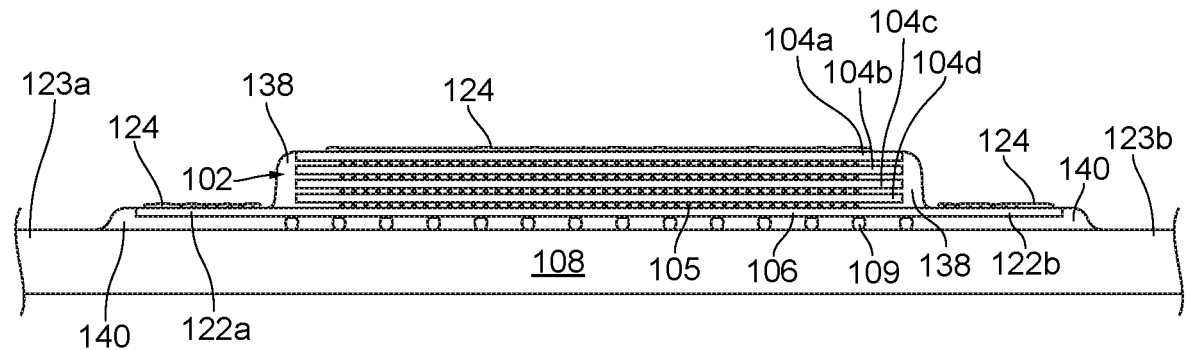
Figure 3H:
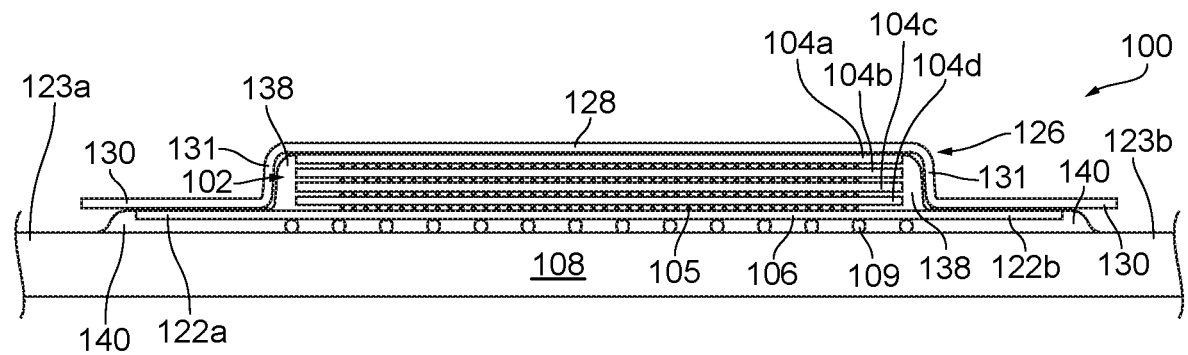

With reference to FIGS. 2 and 3G together, the method 200 can next include forming the thermal interface features 124 (block 210) in direct contact with exposed portions of the upper major surface 110 of the stack 102 and the upper major surface 116 of the second semiconductor die 106. For example, volumes of a thermal interface paste or pieces of thermal interface tape can be disposed at these exposed surfaces. Alternatively or in addition, volumes of a thermal interface paste or pieces of thermal interface tape can disposed on a lower surface of the heat spreader 126 before the heat spreader 126 is attached to other portions of the semiconductor die assembly 100. Finally, with reference to FIGS. 2 and 3G together, the method 200 can include thermally coupling the heat spreader 126 to the first semiconductor dies 104 and to the second semiconductor die 106 via the thermal interface features 124 (block 212). When the thermal interface features 124 include volumes of thermal interface paste, the heat spreader 126 can compress and laterally expand the volumes of thermal interface paste. After the heat spreader 126 is suitably positioned, the volumes of thermal interface paste can be cured (e.g., thermally cured) to secure the heat spreader 126.

Figure 4A:
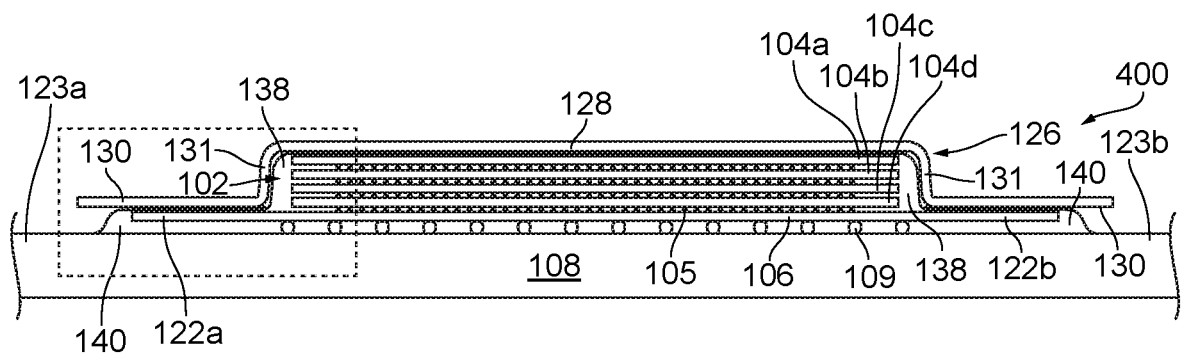
FIG. 4A is a cross-sectional side view of a semiconductor die assembly in accordance with another embodiment of the present technology.
Figure 4B:
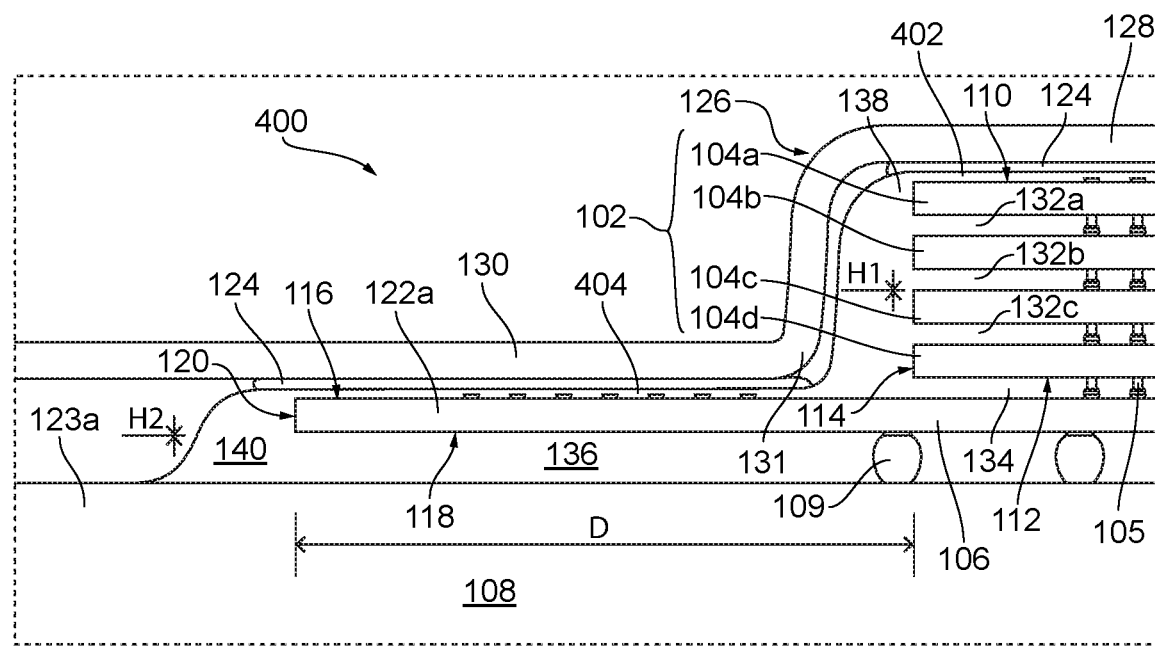
FIG. 4B is an enlarged view of a portion of FIG. 4A.

FIG. 4A is a cross-sectional side view of a semiconductor die assembly 400 in accordance with another embodiment of the present technology, and FIG. 4B is an enlarged view of a portion of FIG. 4A. In some cases, it may be desirable to fully encapsulate the first semiconductor dies 104 and the second semiconductor die 106 in the MUF material, such as to enhance durability. In these and other cases, the upper major surface 110 of the stack 102 and the upper major surface 116 of the second semiconductor die 106 can be mostly or entirely covered with a thin overlay of MUF material as shown in FIGS. 4A and 4B. The embodiment of the semiconductor die assembly 400 shown in FIG. 4B has a first molded overlay 402 in direct contact with the upper major surface 110 of the stack 102 and second molded overlays 404 (FIG. 4B) in direct contact with the upper major surface 116 of the second semiconductor die 106 at the peripheral portions 122 of the second semiconductor die 106. In other embodiments, at least a portion of the upper surface of the package substrate 108 can likewise be covered with MUF material.

With reference again to FIGS. 4A and 4B, the first and second molded overlays 402, 404 can be relatively thin. For example, one or both of the first and second molded overlays 402, 404 can have an average thickness perpendicular to the upper major surface 116 of the second semiconductor die 106 of at most 10% (e.g., at most 5%) of the distance D by which the peripheral portions 122 of the second semiconductor die 106 extend laterally outward beyond the edge surface 114 of the stack 102. Thus, the stack 102 can be thermally coupled to the heat spreader 126 via the first molded overlay 402 and the corresponding thermal interface feature 124. Similarly, the second semiconductor die 106 can be thermally coupled to the heat spreader 126 via the second molded overlays 404 and the corresponding thermal interface features 124. In another embodiment, the first molded overlay 402 can be present and the second molded overlays 404 can be absent. In still another embodiment, the first molded overlay 402 can be absent and the second molded overlays 404 can be present.

Figure 5:
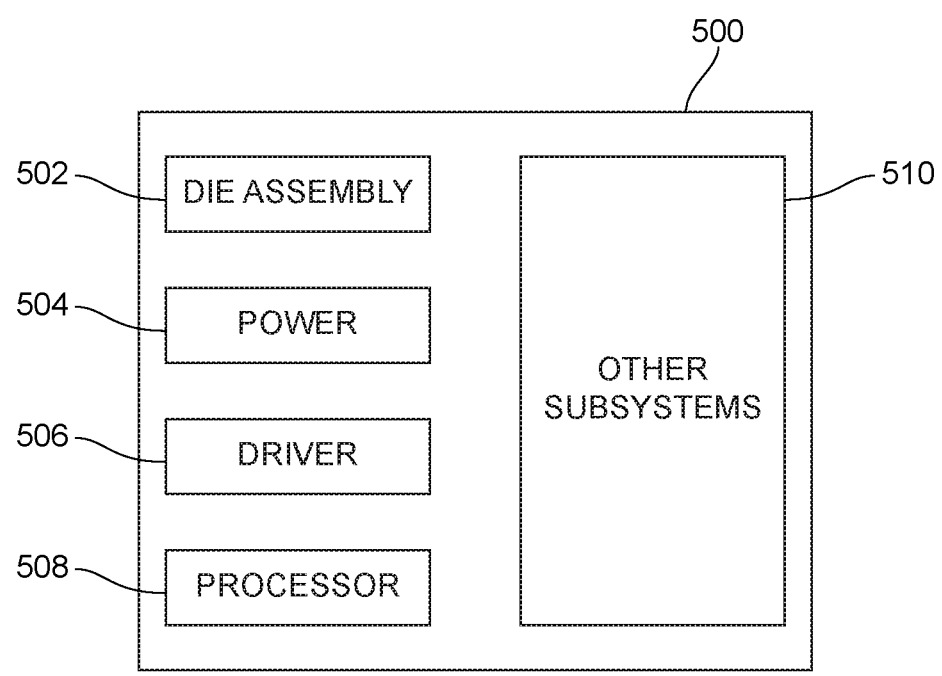
FIG. 5 is a schematic view of a system that includes a semiconductor die assembly in accordance with an embodiment of the present technology.

Any one of the semiconductor die assemblies described above with reference to FIGS. 1-4B can be incorporated into any of a myriad of larger and/or more complex systems, a representative example of which is system 500 shown schematically in FIG. 5. The system 500 can include a semiconductor die assembly 502, a power source 504, a driver 506, a processor 508, and/or other subsystems or components 510. The semiconductor die assembly 502 can include features generally similar to those of the semiconductor die assemblies described above, and can therefore include a molded MUF material in a form that facilitates heat dissipation and improves manufacturability. The resulting system 500 can perform any of a wide variety of functions, such as memory storage, data processing, and/or other suitable functions. Accordingly, representative systems 500 can include, without limitation, hand-held devices (e.g., mobile phones, tablets, digital readers, and digital audio players), computers, and appliances. Components of the system 500 may be housed in a single unit or distributed over multiple, interconnected units (e.g., through a communications network). The components of the system 500 can also include remote devices and any of a wide variety of computer readable media.

This disclosure is not intended to be exhaustive or to limit the present technology to the precise forms disclosed herein. Although specific embodiments are disclosed herein for illustrative purposes, various equivalent modifications are possible without deviating from the present technology, as those of ordinary skill in the relevant art will recognize. In some cases, well-known structures and functions have not been shown and/or described in detail to avoid unnecessarily obscuring the description of the embodiments of the present technology. Although steps of methods may be presented herein in a particular order, in alternative embodiments the steps may have another suitable order. Similarly, certain aspects of the present technology disclosed in the context of particular embodiments can be combined or eliminated in other embodiments. Furthermore, while advantages associated with certain embodiments may have been disclosed in the context of those embodiments, other embodiments may also exhibit such advantages, and not all embodiments need necessarily exhibit such advantages or other advantages disclosed herein to fall within the scope of the present technology.

Throughout this disclosure, the singular terms "a," "an," and "the" include plural referents unless the context clearly indicates otherwise. Similarly, unless the word "or" is expressly limited to mean only a single item exclusive from the other items in reference to a list of two or more items, then the use of "or" in such a list is to be interpreted as including (a) any single item in the list, (b) all of the items in the list, or (c) any combination of the items in the list. Additionally, the terms "comprising" and the like may be used herein to mean including at least the recited feature(s) such that any greater number of the same feature(s) and/or one or more additional types of features are not precluded. Directional terms, such as "upper," "lower," "front," "back," "vertical," and "horizontal," may be used herein to express and clarify the relationship between various elements. It should be understood that such terms do not denote absolute orientation. Reference herein to "one embodiment," "an embodiment," or similar formulations means that a particular feature, structure, operation, or characteristic described in connection with the embodiment can be included in at least one embodiment of the present technology. Thus, the appearances of such phrases or formulations herein are not all referring to the same embodiment. Furthermore, various particular features, structures, operations, or characteristics may be combined in any suitable manner in one or more embodiments of the present technology.

We claim:

1. A semiconductor die assembly, comprising:
   a first semiconductor die having an upper surface, an edge surface extending from a perimeter portion of the upper surface, and a first footprint;
   a second semiconductor die carrying the first semiconductor die, wherein the second semiconductor die has a second footprint larger than the first footprint such that the second semiconductor die includes a peripheral portion extending beyond the first footprint;
   a heat spreader thermally coupled to the first semiconductor die and to the peripheral portion of the second semiconductor die;
   a molded underfill material extending at least partially over the upper surface of the first semiconductor die, along the edge surface of the first semiconductor die, and over the peripheral portion of the second semiconductor die;
   a first planar thermal interface feature having a first side in direct contact with a first portion of the molded underfill material disposed over the upper surface of the first semiconductor die and an opposite second side in direct contact with the heat spreader; and
   a second planar thermal interface feature having a first side in direct contact with a second portion of the molded underfill material disposed over the peripheral portion of the second semiconductor die, and an opposite second side in direct contact with the heat spreader.

2. The semiconductor die assembly of claim 1 wherein the first and second planar thermal interface features comprise pieces of thermal interface tape, volumes of thermal interface paste, or a combination thereof.

3. The semiconductor die assembly of claim 1 wherein the heat spreader is press-formed.

4. The semiconductor die assembly of claim 1 wherein a third portion of the molded underfill material disposed along the edge surface of the first semiconductor die has a mid-height draft angle within a range from 0.5 degree to 5 degrees.

5. The semiconductor die assembly of claim 1 wherein the heat spreader includes a generally planar first portion over the first die, a generally planar second portion over the peripheral portion of the second semiconductor die, and a step between the first and second portions of the heat spreader, wherein the first portion of the heat spreader is attached to the first portion of the molded peripheral structure through the first planar thermal interface feature and the second portion of the heat spreader is attached to the second portion of the molded peripheral structure through the second planar thermal interface feature.

6. A semiconductor die assembly, comprising:
   a first semiconductor die;
   a second semiconductor die carrying the first semiconductor die, the second semiconductor die having a first peripheral portion extending laterally outward beyond a first edge surface of the first semiconductor die;
   a package substrate carrying the first and second semiconductor dies, wherein the package substrate includes a second peripheral portion extending laterally outward beyond a second edge surface of the second semiconductor die;
   a first volume of molded underfill material between the first semiconductor die and the second semiconductor die;
   a second volume of molded underfill material between the package substrate and the second semiconductor die;
   a first molded peripheral structure overlying an inner part of the first peripheral portion of the second semiconductor die and extending at least partially along the first edge surface, wherein an outer part of the first peripheral portion of the second semiconductor die is laterally between the first molded peripheral structure and the second edge surface of the second semiconductor die; and a second molded peripheral structure overlying the second peripheral portion of the package substrate and extending at least partially along the second edge surface.

7. The semiconductor die assembly of claim 6 wherein the first and second volumes of molded underfill material and the first and second molded peripheral structures have respective average thermal conductivities within a range from 1 watt per meter kelvin to 3 watts per meter kelvin.

8. The semiconductor die assembly of claim 6 wherein the first molded peripheral structure has a mid-height draft angle within a range from 0.5 degree to 5 degrees.

9. The semiconductor die assembly of claim 6 wherein the second molded peripheral structure has a mid-height draft angle at least 50% greater than a mid-height draft angle of the first molded peripheral structure.

10. The semiconductor die assembly of claim 6, further comprising a molded overlay in direct contact with the first semiconductor die, wherein the molded overlay has an average thickness of at most 10% of an average distance by which the first peripheral portion of the second semiconductor die extends laterally outward beyond the first edge surface of the first semiconductor die.

11. The semiconductor die assembly of claim 6, further comprising a molded overlay in direct contact with the first peripheral portion of the second semiconductor die, wherein the molded overlay has an average thickness of at most 10% of an average distance by which the first peripheral portion of the second semiconductor die extends laterally outward beyond the first edge surface of the first semiconductor die.

12. The semiconductor die assembly of claim 6, further comprising interconnects laterally spaced apart between the second semiconductor die and the package substrate, wherein the second volume of molded underfill material extends around the interconnects, and wherein the interconnects include solder.

13. The semiconductor die assembly of claim 6 wherein the first molded peripheral structure overlies at most 30% of a total area of the first peripheral portion of the second semiconductor die.

14. The semiconductor die assembly of claim 6, further comprising a thermal interface feature in direct contact with the first semiconductor die.

15. The semiconductor die assembly of claim 14 wherein:
the thermal interface feature is a first thermal interface feature; and
the semiconductor die assembly further comprises a second thermal interface feature in direct contact with a portion of the first peripheral portion of the second semiconductor die.

16. The semiconductor die assembly of claim 15, further comprising a heat spreader thermally coupled to the first semiconductor die and to the first peripheral portion of the second semiconductor die via the first and second thermal interface features, respectively.

17. The semiconductor die assembly of claim 15 wherein the first and second thermal interface features comprise, pieces of thermal interface tape, volumes of thermal interface paste, or a combination thereof.

18. The semiconductor die assembly of claim 6, further comprising a conformal heat spreader with a generally planar first portion over the first die, a generally planar second portion over the first peripheral portion of the second semiconductor die, and a step between the first and second portions, wherein the first portion is attached to the first die by a first thermal interface feature and the second portion is attached to the first peripheral portion of the second die by a second thermal interface feature.

19. The semiconductor die assembly of claim 6, further comprising a third volume of molded underfill material comprising the first volume of molded underfill material and the second volume of molded underfill material, wherein the third volume of molded underfill material is continuous.

* * * * *